US006881893B1

United States Patent
Cobert

(10) Patent No.: US 6,881,893 B1
(45) Date of Patent: Apr. 19, 2005

(54) SOLAR ENERGY COLLECTION SYSTEM

(76) Inventor: David M. Cobert, 2700 Nielson Way, Apt. 1233, Santa Monica, CA (US) 90405

( * ) Notice: Subject to any disclaimer, the term of this patent is extended or adjusted under 35 U.S.C. 154(b) by 4 days.

(21) Appl. No.: 10/458,151

(22) Filed: Jun. 10, 2003

Related U.S. Application Data

(60) Provisional application No. 60/387,731, filed on Jun. 11, 2002.

(51) Int. Cl.[7] .............................................. H01L 31/052
(52) U.S. Cl. ...................... 136/246; 136/251; 136/259; 257/432; 257/433; 126/683
(58) Field of Search ................................. 136/251, 246, 136/259; 257/432, 433; 126/683

(56) References Cited

U.S. PATENT DOCUMENTS

| 4,114,592 | A | * | 9/1978 | Winston ..................... 126/683 |
| 4,347,834 | A | | 9/1982 | York |
| 5,409,550 | A | * | 4/1995 | Safir ........................... 136/246 |
| 5,772,791 | A | * | 6/1998 | Laing .......................... 136/246 |
| 5,971,551 | A | * | 10/1999 | Winston et al. ............. 359/868 |
| 6,057,505 | A | * | 5/2000 | Ortabasi ..................... 136/246 |
| 6,091,020 | A | | 7/2000 | Fairbanks et al. |
| 6,111,190 | A | | 8/2000 | O'Neill |
| 6,252,155 | B1 | | 6/2001 | Ortabasi |
| 6,384,320 | B1 | * | 5/2002 | Chen .......................... 136/259 |
| 6,653,551 | B1 | * | 11/2003 | Chen .......................... 136/246 |
| 6,717,045 | B1 | * | 4/2004 | Chen .......................... 136/246 |

* cited by examiner

*Primary Examiner*—Alan Diamond
(74) *Attorney, Agent, or Firm*—Edward A. Sokolski

(57) ABSTRACT

Sunlight is localized at a solar cell by means of a lens in conjunction with a solar energy trap with very low losses. The lens is a standard magnifying lens which concentrates the sunlight to a spot which is a small percentage of the total area of the lens. The lens is fixed at a tilt angle which is in accordance with the latitude of the site of the solar collection. The daily arc of the sun across the face of the lens produces a smooth arc path of the spot in three dimensional spaces. At or near the smooth arc in space, a guide which may be a secondary mirror surface or an opening guides the light into a solar trap. The solar trap is a fully mirrored enclosed space which permits light to enter but not leave the trap. The light in the trap is guided to a solar cell within the trap with reflected and scattered light being absorbed by the solar cell.

3 Claims, 2 Drawing Sheets

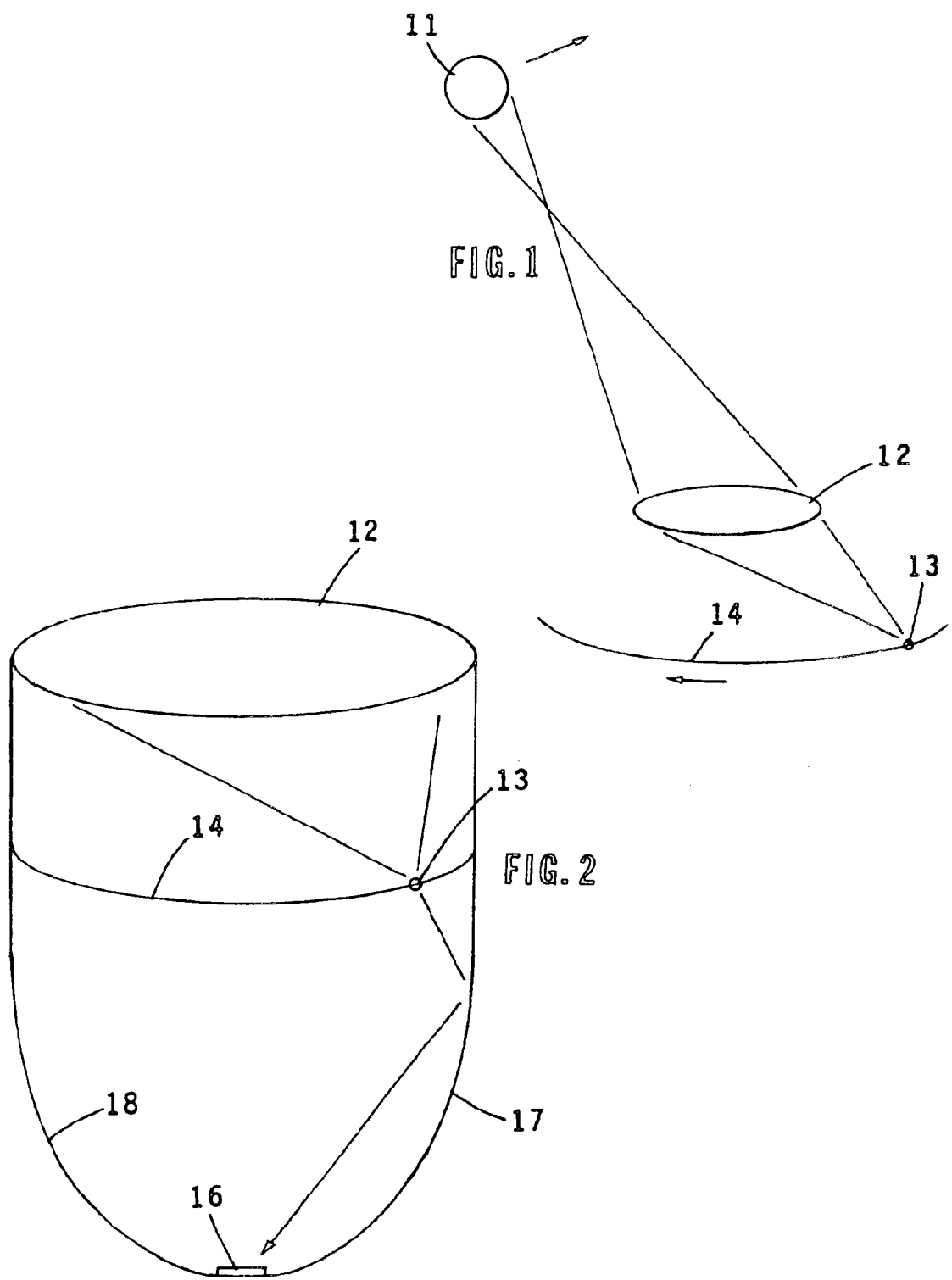

SOLAR ENERGY COLLECTION SYSTEM

SPECIFICATION

This application claims the benefit of Provisional Application No. 60/387,731 filed Jun. 11, 2002.

BACKGROUND OF THE INVENTION

1. Field of the Invention

This invention relates to a system for generating electrical energy from solar energy and more particularly to such a system which employs a solar cell onto which solar light is concentrated.

2. Description of the Related Art

Devices for generating electric energy from solar energy are well known in the art and as described in U.S. Pat. No. 6,057,505 issued May 2, 2000 may employ a compartment, a "cusp" or trap having mirrored sides which receives the solar energy and by means of a lens located within the compartment or trap concentrates the received solar energy onto a solar cell within the compartment. Such prior art devices generally require the tracking of the sun both in longitude and latitude on a daily and seasonal basis to obtain the needed concentration of solar energy, increasing the complexity and cost while decreasing reliability. This is because if the sunlight is not concentrated before it enters the compartment by tracking the sun, as mentioned above, it does not have the intensity in the compartment that is needed for proper operation of the system.

SUMMARY OF THE INVENTION

The device of the invention overcomes the shortcomings of the prior art in obviating the need for tracking the sun to provide the solar energy needed to excite the solar cell sufficiently to provide the needed electrical power. This end result is achieved by concentrating the sun's rays by means of a lens which is external of the compartment in which the solar cell is mounted. The sun's rays can thereby be concentrated by the lens to a spot on the mirrored wall of the compartment and reflected from the compartment wall onto the cell. The lens is fixed at a tilt in accordance with the latitude of the site. The daily arc of the sun across the face of the lens produces a smooth three dimensional arcuate path of the spot. Though the spot size and shape will change in accordance with the angle of the sun relative to the lens, the concentration will still remain substantial.

It is therefore an object of this invention to provide a simpler less complex and less expensive system for concentrating solar energy onto a solar cell to generate electrical energy.

It is a further object of this invention to provide a solar energy collection system in which the solar energy is focused onto the solar cell by means of a lens which is external to the compartment in which the solar cell is mounted thereby obviating the need to constantly adjust the positioning of the system with changes in the relative position of the sun.

Other objects of the invention will become apparent from following description taken in connection with the accompanying drawings.

DESCRIPTION OF THE DRAWINGS

FIG. 1 is a schematic drawing illustrating the operation of the system of the invention;

FIG. 2 is a diagrammatic view of a preferred embodiment of the invention;

DETAILED DESCRIPTION OF THE INVENTION

Referring to FIG. 1, a schematic drawing illustrating the operation of the system of the invention is shown. The rays of the sun 11 strike lens 12, which is a standard magnifying lens and are focused onto a spot 13 which is within a compartment or trap. The lens is fixed at a tilt angle which is in accordance with the latitude of the site. The daily arc of the sun across the face of the lens produces a smooth arc path 14 in three dimensional space. At or near this arc path is either a secondary mirrored surface or an opening to guide the light into the solar trap.

Figure 2A:
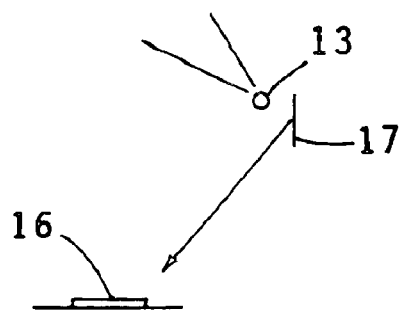
FIG. 2A is a diagrammatic view illustrating the operation of the mirror surface of the compartment of the preferred embodiment.
Figure 2B:
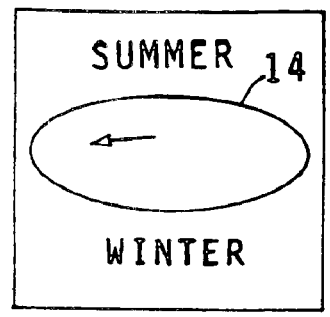
FIG. 2B is a diagrammatic view illustrating the operation of the preferred embodiment with changes in the position of the sun.

Referring now to FIGS. 2, 2A and 2B, a preferred embodiment of the invention is illustrated schematically. The solar light rays are focused by lens 12 onto spot 13 located within light trap or compartment 17. The insides walls of the light trap are mirrored so that the rays are reflected onto solar cell 16 which generates electrical energy. As previously pointed out, the focused spot moves along the ar path 14 of the sun during the day. At or near the "arc" formed in space is either an opening or a secondary mirror surface to guide the light into the light trap 17. The shape of the secondary mirror or opening will tend to adjust the concentration and direction of the light energy to optimize its use so as to increase efficiency and enable the use of a less expensive solar cell. The shape of the light trap 17 may be parabolic in cross section, spherical with a circular cross section or a modified hybrid shape such that the collection of light energy at the solar cell 16 is optimized. FIG. 2A illustrates the reflection of light from the sides of the trap to the solar cell while FIG. 2B illustrates the arc path 14 for the sun during summer and winter.

Figure 3:
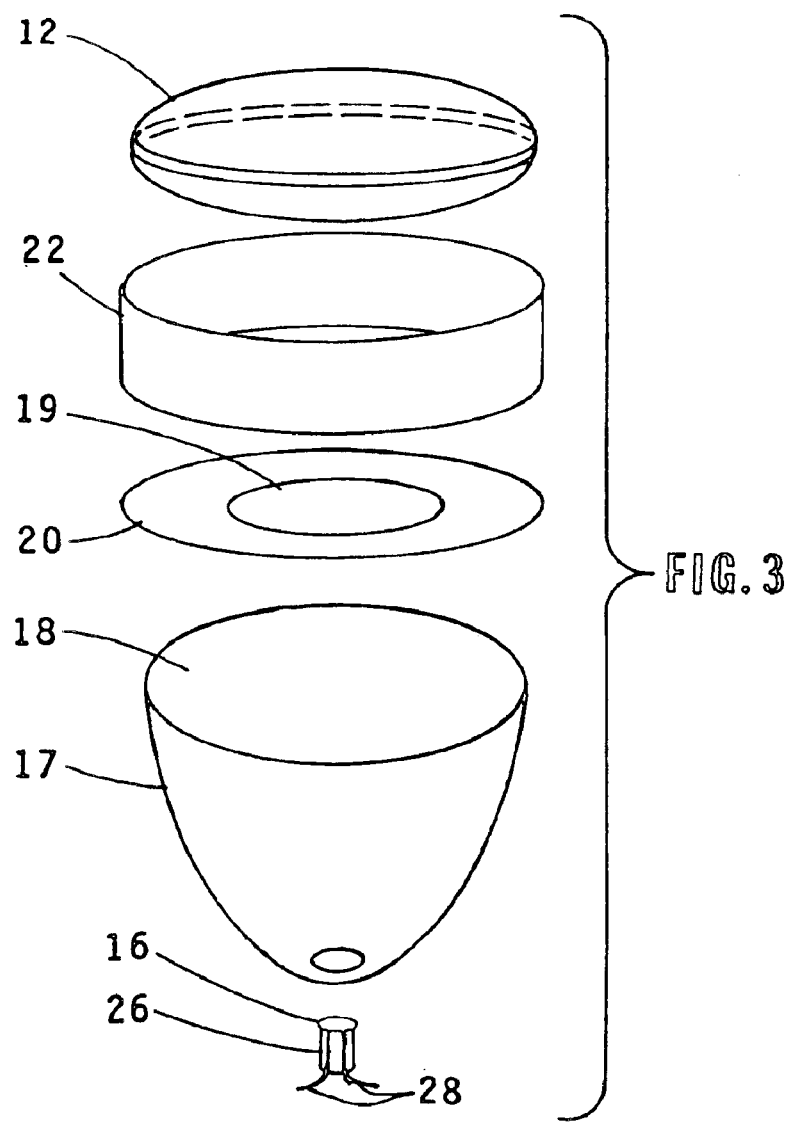
FIG. 3 is an exploded perspective view of the preferred embodiment

Referring now to FIG. 3, a preferred embodiment of the invention is illustrated. Lens 12 is mounted on the very top of the assembly and concentrates the light energy from the sun through aperture 19 formed in circular plates 20. Aperture 19 has an optical coating thereover which permits the passage of light therethrough from above but partially reflects light coming back from the trap. This end result is achieved by means of an optical half wavelength optical coating beneath a dielectric plate which enhances reflection of light back into the trap and a quarter wavelength optical coating above the dielectric plate which tends to enhance the passage of light from the lens into the trap. Plate 20 has a light reflective mirrored bottom surface. The concentration of the light energy need not be at a focal point when entering the aperture. The lens may be a standard magnifying lens, a Fresnel type lens or other type of light concentrating lens and may be round (as shown) elliptical, rectangular or irregular in general shape when looking in the direction of the light path. A covering plate may be employed to keep the lens surface clean.

A standoff 22 on which the lens is mounted holds the lens above plate 20 to allow some degree of light concentration before the light energy passes through aperture 19. Standoff 22 may be of metal or plastic and may have an inner reflective surface.

After the light energy has passed through aperture 19, it enters light trap or compartment 17 which has an inner mirrored surface 18. As previously noted the shape of the trap may be parabolic in cross section, spherical with a circular cross section, conical or a modified hybrid shape to optimize the collection of light energy by the solar cell. Trap 17 may be fabricated of a reflective metal with a polished interior or of a plastic or dielectric material with a mirrored inner surface. Light energy that does not hit the solar cell 16 directly on first pass will be reflected back towards the apertured plate 20 and will be reflected back by the mirrored bottom surface of the plate towards the solar cell. Partial reflection is also provided in the downward direction by the quarter wave optical coating covering aperture 19, as mentioned above.

The solar cell 16 is mounted on a clear plastic standoff 26 or in the alternative by a standoff made of glass, Plexiglas with liquid or gaseous cooling. The electric leads 28 can be connected to an inverter, to a device utilizing direct current or to a storage battery or the like.

While the invention has been described and illustrated in detail, it is to be understood that this is by way of illustration and example only and is not to be taken by way of limitation, the spirit and scope of the invention being limited only by the terms of the following claims.

I claim:

1. A system for generating electrical energy from solar energy comprising:

a compartment having an open top portion and inner walls which have high light reflectivity;

a solar cell mounted within said compartment;

a lens mounted above the open top portion of said compartment;

a standoff member for separating the lens from the compartment, the bottom end of said standoff member being opposite the open top portion of said compartment, the lens being mounted on the top end of said standoff member; and a plate member having an aperture formed therein mounted between the bottom end of said standoff member and the open top portion of said compartment, the solar energy passing through said aperture;

solar energy being concentrated by said lens at a spot along the inner walls of said compartment and reflected from the inner walls of said compartment onto said solar cell, said solar cell thereby generating electrical energy.

2. The system of claim 1 wherein an inner wall of said plate member is light reflective.

3. The system of claim 1 wherein the aperture of said plate member has an optical coating thereon which permits the passage of solar energy coming from said lens there through to said compartment and minimizes the escape of solar energy from said compartment.

* * * * *